(12) United States Patent
Lin

(10) Patent No.: US 7,619,458 B2
(45) Date of Patent: Nov. 17, 2009

(54) DELAY-LOCK LOOP AND METHOD ADAPTING ITSELF TO OPERATE OVER A WIDE FREQUENCY RANGE

(75) Inventor: Feng Lin, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 517 days.

(21) Appl. No.: 11/521,837

(22) Filed: Sep. 14, 2006

(65) Prior Publication Data

US 2007/0011483 A1    Jan. 11, 2007

Related U.S. Application Data

(62) Division of application No. 11/142,946, filed on Jun. 1, 2005, now Pat. No. 7,158,443.

(51) Int. Cl.
*H03K 3/00*    (2006.01)
(52) U.S. Cl. ........................... 327/291; 327/295
(58) Field of Classification Search ................ None
See application file for complete search history.

(56) References Cited

U.S. PATENT DOCUMENTS

| | | | | |
|---|---|---|---|---|
| 4,952,888 | A | 8/1990 | Izumi | 332/124 |
| 5,463,337 | A * | 10/1995 | Leonowich | 327/158 |
| 5,771,264 | A | 6/1998 | Lane | 375/376 |
| 5,786,715 | A * | 7/1998 | Halepete | 327/116 |
| 5,801,559 | A * | 9/1998 | Sawai et al. | 327/116 |
| 6,005,420 | A * | 12/1999 | Yoshizawa et al. | 327/116 |
| 6,043,717 | A | 3/2000 | Kurd | 331/17 |
| 6,049,254 | A * | 4/2000 | Knapp et al. | 331/16 |
| 6,066,969 | A | 5/2000 | Kawasaki et al. | 327/156 |
| 6,157,247 | A | 12/2000 | Abdesselem et al. | 327/540 |
| 6,181,174 | B1 * | 1/2001 | Fujieda et al. | 327/158 |
| 6,198,689 | B1 | 3/2001 | Yamazaki et al. | 365/233 |
| 6,292,040 | B1 | 9/2001 | Iwamoto et al. | 327/158 |
| 6,437,616 | B1 | 8/2002 | Antone et al. | 327/158 |
| 6,510,191 | B2 | 1/2003 | Bockelman | 375/371 |
| 6,621,312 | B2 | 9/2003 | Tang et al. | 327/156 |
| 6,720,810 | B1 * | 4/2004 | New | 327/158 |
| 6,798,266 | B1 | 9/2004 | Vu et al. | 327/291 |
| 6,842,399 | B2 | 1/2005 | Harrison | 365/233 |
| 6,859,028 | B2 | 2/2005 | Toner | 324/76.53 |
| 6,894,539 | B2 * | 5/2005 | Kim | 327/3 |
| 6,903,615 | B2 | 6/2005 | Landman et al. | 331/57 |
| 2002/0056854 | A1 | 5/2002 | Tang et al. | 257/200 |

(Continued)

*Primary Examiner*—Cassandra Cox
(74) *Attorney, Agent, or Firm*—Dorsey & Whitney LLP

(57) ABSTRACT

A delay-lock loop receives an input clock signal from the output of a programmable divider that receives a reference clock signal. The delay-lock loop includes a voltage-controlled delay line generating a plurality of delayed clock signals having different phases. A plurality of the delayed clock signals are combined to generate a plurality of output signals. During an initialization period, an initialization circuit sets the delay of the delay line to a minimum delay value and then compares this delay value to the period of the input clock signal. Based on this comparison, the initialization circuit programs the programmable divider and adjusts the number of delayed clock signals combined to generate the output signals. More specifically, as the frequency of the reference clock signal increases, the divider is programmed to divide by a greater number, and a larger number of delay clock signals are combined to generate the output signals.

7 Claims, 9 Drawing Sheets

U.S. PATENT DOCUMENTS

| | | | |
|---|---|---|---|
| 2002/0109495 A1 | 8/2002 | Antone et al. | 324/76.54 |
| 2004/0064752 A1 | 4/2004 | Kazachinsky et al. | 713/500 |
| 2005/0077937 A1 | 4/2005 | Meyer | 327/158 |
| 2006/0018370 A1 | 1/2006 | Mizuno | 375/150 |

* cited by examiner

DELAY-LOCK LOOP AND METHOD ADAPTING ITSELF TO OPERATE OVER A WIDE FREQUENCY RANGE

CROSS-REFERENCE TO RELATED APPLICATION

This application is a divisional of pending U.S. patent application Ser. No. 11/142,946, filed Jun. 1, 2005.

TECHNICAL FIELD

The present invention is directed to memory and other electronic devices employing delay-lock loops, and more particularly, to a delay-lock loop and method that reconfigures itself to permit operation over a wide frequency range.

BACKGROUND OF THE INVENTION

Periodic digital signals are commonly used in a variety of electronic devices, such as memory devices. Probably the most common of periodic digital signals are clock signals that are typically used to establish the timing of a digital signal or the timing at which an operation is performed on a digital signal. For example, data signals are typically coupled to and from memory devices, such as synchronous dynamic random access memory ("SDRAM") devices, in synchronism with a clock or data strobe signal. Clock or data strobe signals are typically distributed to a number of circuits in the SDRAM devices through a "clock tree" and are used by the circuits to latch or capture the data signals.

As the speed of memory devices and other devices continue to increase, the "eye" or period in which a digital signal, such as a data signal, is valid becomes smaller and smaller, thus making the timing of a strobe signal or other clock signal used to capture the digital signal even more critical. In particular, as the size of the eye becomes smaller, the propagation delay of the strobe signal can be different from the propagation delay of the captured digital signal(s). As a result, the skew of the strobe signal relative to the digital signal can increase to the point where a transition of the strobe signal is no longer within the eye of the captured signal.

One technique that has been used to ensure the correct timing of a strobe signal relative to captured digital signals is to use a delay-lock loop ("DLL"), to generate the strobe signal. In particular, a delay-lock loop allows the timing of the strobe signal to be adjusted to minimize the phase error between the strobe signal and the valid eye of the digital signal. A typical delay-lock loop uses a delay line (not shown) consisting of a large number of delay stages. A reference clock signal is applied to the delay line, and it propagates through the delay line to the final delay stage, which outputs a delayed clock signal. The phase of the delayed clock signal is compared to the phase of the reference clock signal to generate a phase error signal. The phase error signal is used to adjust the delay provided by the delay stages in the delay line until the phase of the delayed clock signal is equal to the phase of the reference clock signal. The delayed clock signal is then coupled through a clock tree to circuits that will utilize the delayed clock signal.

As the operating speed of memory devices increases, the frequencies of clock signals needed to operate the memory devices at these higher speeds also increases. One difficulty encountered with these higher clock speeds is the difficulty in coupling high frequency clock signals through a clock tree or other signal path to circuits that are to use the clock signals. One approach that has been used to alleviate this problem is to divide the high frequency clock signal to generate a series of low frequency clock signals having multiple phases with transitions that coincide with the transitions of the high frequency clock signal. For example, with reference to FIG. 1, a high frequency clock signal $CLK_1$ is divided into a lower frequency clock signal $CLK_2$, and four phases of the CLK2 signal are generated, which are designated $CLK_{2A}$, $CLK_{2B}$, $CLK_{2C}$ and $CLK_{2D}$. The $CLK_{2D}$ signal has the same phase as the $CLK_2$ signal, the $CLK_{2A}$ signal has a phase of 90 degrees relative to the phase of the $CLK_2$ signal, the $CLK_{2B}$ signal has a phase of 180 degrees relative to the phase of the $CLK_2$ signal, and the $CLK_{2C}$ signal has a phase of 270 degrees relative to the phase of the $CLK_2$ signal. Each of these clock signals $CLK_{2A-D}$ has a rising edge transition that coincides with a respective transition of the $CLK_1$ signal. However, because the $CLK_{2A-D}$ signals have a frequency that is only half the frequency of the $CLK_1$ signal, they can more easily be coupled through a clock tree or other signal path.

Another problem associated with the high operating speed of memory and other devices is excessive power consumption, particularly for portable electronic devices like notebook or other portable computers. Power is consumed each time a digital circuit is switched to change the logic level of a digital signal. The rate at which power is consumed by memory devices therefore increases with both the operating speed of such devices and the number of circuits being switched. Thus, the demands for ever increasing operating speeds and memory capacity are inconsistent with the demands for ever decreasing memory power consumption. A significant amount of power is consumed by delay-lock loops, which are commonly used in memory devices. Delay-lock loops consume a great deal of power because the delay lines used in such loops often contain a large number of delay stages, all of which are switched as a reference clock signal propagates through the delay line. The higher reference clock signal frequencies needed to operate the memory devices at higher speed causes these large number delay stages to be switched at a rapid rate, thereby consuming power at a rapid rate. A significant amount of power is also consumed in distributing clock signals generated by delay-lock loops throughout circuitry that use the clock signals for various purposes.

Attempts have been made to address the problems encountered with using higher clock signal frequencies. However, conventional approaches to solving these problems have been hindered by the wide range of operating speeds at which memory devices using delay-lock loops must be operable. A memory device may divide the frequency of a clock signal to produce a multi-phased clock signal having a lower frequency. However, it may be unnecessary to include circuitry in a memory device for performing these functions if the memory device will be installed in a system having a lower frequency clock signal. If, on the other hand, such circuitry is not included, the memory device may be inoperable when installed in a system having a higher frequency clock signal.

There is therefore a need for a method and system for allowing a memory or other electronic device to operate over a wide range of operating speeds, and may operate in a manner that minimizes power consumption.

SUMMARY OF THE INVENTION

A method and system for providing at least one periodic output clock signal alters its configuration to adapt itself to the frequency of a reference clock signal. The frequency of the reference clock signal is divided by an integer number determined by a select signal to generate a divided clock signal that is applied to a delay-lock loop. The delay-lock loop includes a phase detector and a delay line having a plurality of delay stages, at least one of which generates the at least one periodic output clock signal. An initialization circuit is operative during an initialization period to set the delay of the delay line to a minimum delay value. The timing of the at least one periodic output clock signal from the delay line is then compared to the timing of the reference clock signal. Based on this comparison, the initialization circuit generates the select signal to control the number by which the frequency of the reference clock signal is divided. The system and method may include a phase mixer coupled to the delay stages to receive a plurality of signals having a plurality of different phases. The phase mixer is operable to combine the signals received from the delay line to generate a plurality of periodic output clock signals. The number of the signals received from the delay line that are used to generate the plurality of periodic output clock signals is preferably controlled by the select signal to increase the number of signals used with increasing frequency of the reference clock signal.

DETAILED DESCRIPTION OF THE INVENTION

Figure 1:
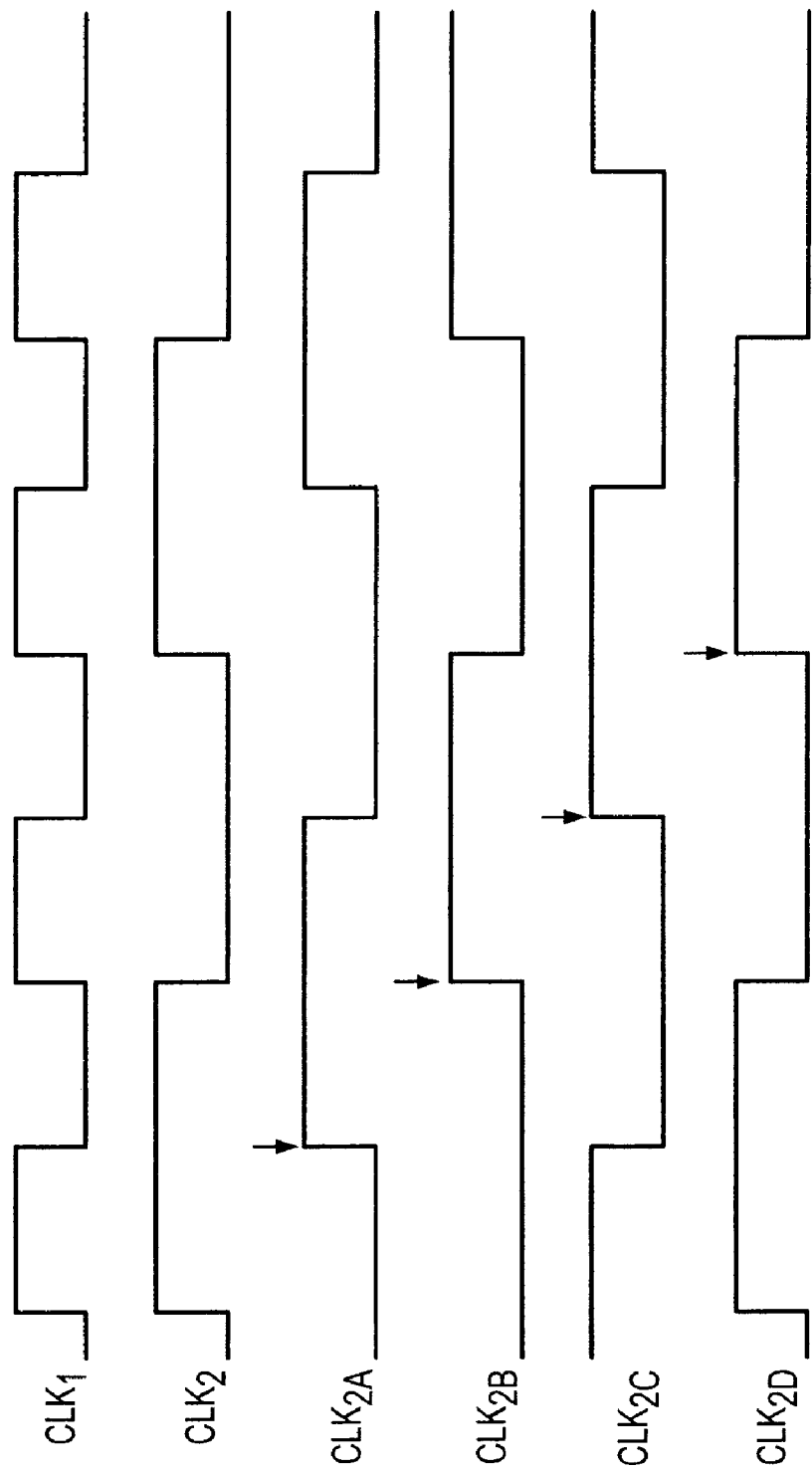
FIG. 1 is a timing diagram illustrating a plurality of multi-phased clock signals having transitions that are synchronized to the transitions of a higher frequency clock signal.
Figure 2:
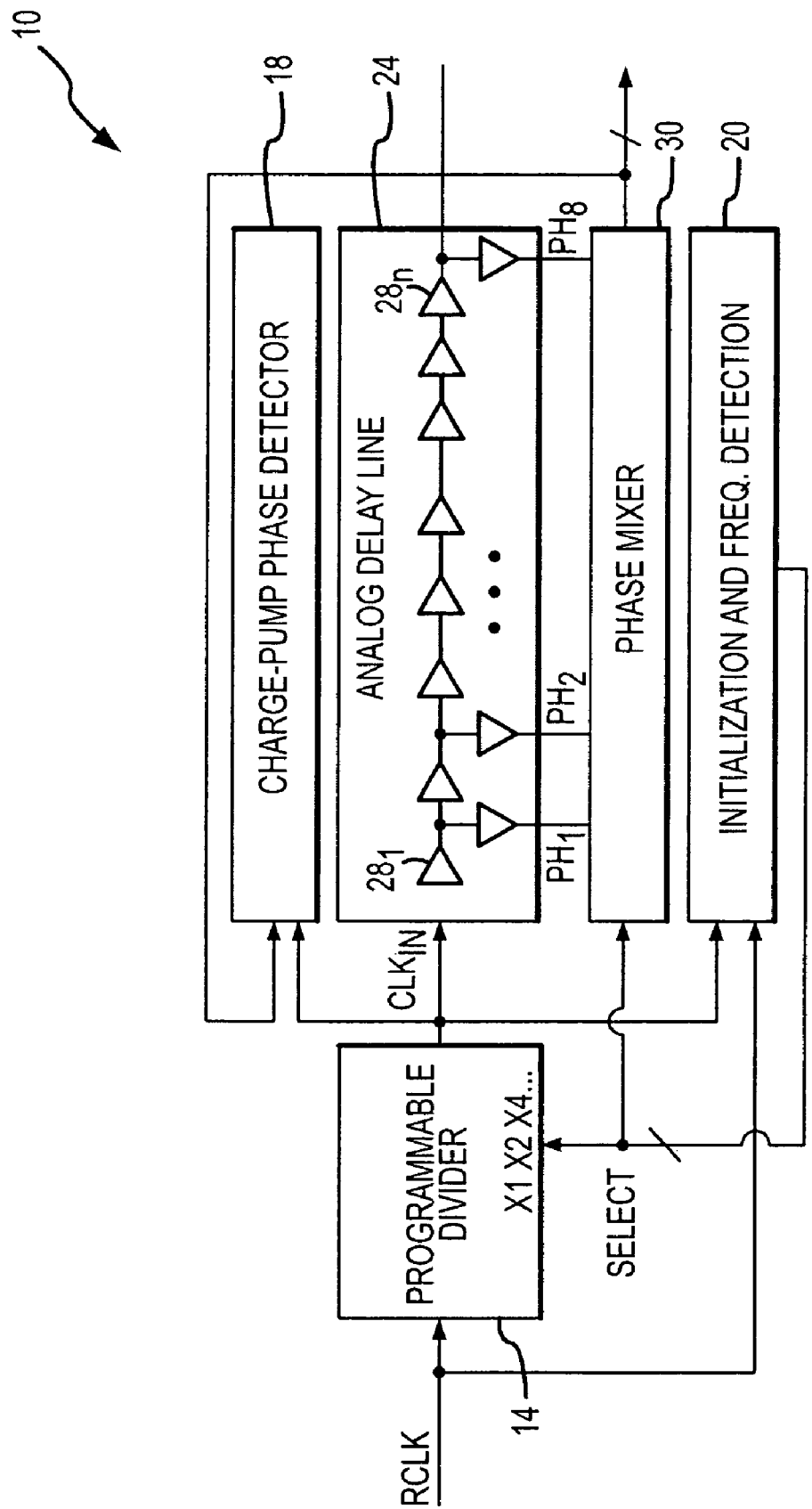
FIG. 2 is a block diagram of a delay-lock loop clock and control circuit according to one example of the invention.

A delay-lock loop and control circuit 10 according to one example of the invention is shown in FIG. 2. The circuit 10 receives a reference clock ("RCLK") signal, which is applied to a programmable divider 14 and an initialization circuit 20. The programmable divider 14 divides the frequency by either 1, 2 or 4 using conventional techniques such as toggling flip-flops, counters or other means. As explained in greater detail below, the divider 14 is programmed by SELECT signals from the initialization circuit 20 to divide the RCLK signal by a larger number as the frequency of the RCLK signal increases. A $CLK_{IN}$ signal generated by the divider 14 is applied to the input of a voltage controlled delay line ("VCDL") 24, which is formed by a plurality of identical delay stages $28_{1-N}$. The final delay stage $28_N$ outputs a delayed clock signal, which, as explained below, is applied to a second input of the phase detector 18. The phase detector 18 applies a control signal to the VCDL 24 to control the delay of the VCDL 24, which has the effect of controlling the phase of the signals output from each of the delay stages $28_{1-N}$ relative to the phase of the $CLK_{IN}$ signal. In the example shown in FIG. 2, the VCDL 24 has eight delay stages $28_{1-8}$.

In operation, the phase detector 18 compares the phase of the $CLK_{IN}$ signal to the phase of the signal generated by the final delay stage $28_N$ and adjusts the delay of the VCDL 24 to minimize the phase difference. The delay provided by each of the delay stages $28_{1-8}$ is the same since the delay stages are identical to each other. As a result, the $PH_{1-N}$ signals produced by the delay stages $28_{1-N}$, respectively, have phases that are equally spaced from each other, and the phase of the signal $PH_N$ is equal to the phase of the $CLK_{IN}$ signal. For example, if four delay stages $28_{1-4}$ are included in the VCDL 24, the $PH_1$ signal will have a phase of 90 degrees relative to the $CLK_{IN}$ signal, the $PH_2$ signal will have a phase of 180 degrees relative to the $CLK_{IN}$ signal, the $PH_3$ signal will have a phase of 270 degrees relative to the $CLK_{IN}$ signal, and the $PH_4$ signal will have a phase of 360 degrees relative to the $CLK_{IN}$ signal. In the example shown in FIG. 2 in which the programmable divider 14 can divide the RCLK signal by 4, the VCDL 24 includes eight delay stages $28_{1-8}$ that have phases relative to the phase of the $CLK_{IN}$ signal of 45, 90, 135, 180, 225, 270, 315 and 360 degrees.

The $PH_{1-8}$ signals from the delay stages $28_{1-8}$, respectively, are applied to a phase mixer 30. The structure of the phase mixer 30 will be described in greater detail in connection with FIG. 4. Basically, the phase mixer 30 generates four signals all of which have a frequency that is half the frequency of the RCLK signal, and with phases that are equally phase shifted from each other and having transitions that coincide with the transitions of the RCLK signal. As a result, the signals generated by the phase mixer 30 can be routed through a memory or other electronic device relatively easy, and these signals can be used to capture or latch digital signals in the same manner as if the RCLK signal was routed through the device.

Figure 3:
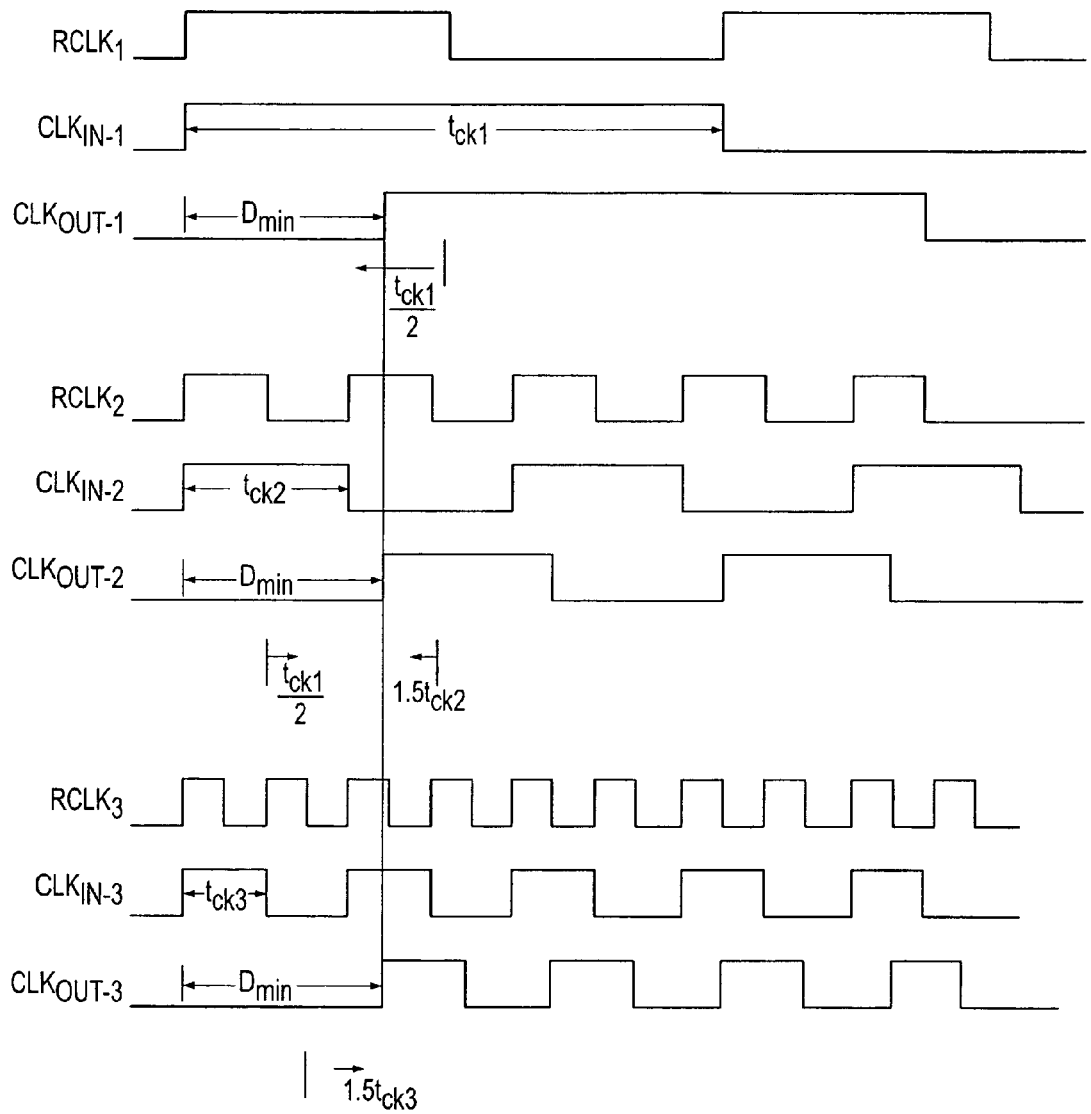
FIG. 3 is a timing diagram showing the principle of operation of the initialization circuit that is used in the delay-lock loop clock and control circuit of FIG. 2.

As mentioned above, the initialization circuit 20 is used to program the divider 14 based on the frequency of the RCLK signal. More specifically, the initialization circuit 20 generates SELECT signals that program the divider 14 based on the frequency of the RCLK signal relative to the minimum delay of the VCDL 24. During initialization, divider 14 is programmed to divide the RCLK signal by two, and the delay of the VCDL 24 is set to its minimum delay value. This minimum delay value is then compared to the period of the RCLK signal and the period of the $CLK_{IN}$ signal. The manner in which this comparison is made will now be explained with reference to the timing diagram of FIG. 3. As will be appreciated by one skilled in the art, logic circuitry operable to generate the SELECT signals based on the various combinations of input signals can easily be provided. FIG. 3 shows examples of the operation of the initialization circuit 20 for an $RCLK_1$ signal having a relatively low frequency, an $RCLK_2$ signal having a higher frequency, and an $RCLK_3$ signal having a still higher frequency. As shown in FIG. 3, the low frequency $RCLK_1$ signal is divided by the programmable divider 14 to produce the $CLK_{IN-1}$ signal, which has half the frequency of the $RCLK_1$ signal. The $CLK_{IN-1}$ signal is applied to the input of the VCDL 24, which outputs a $CLK_{OUT-1}$ signal with the minimum delay $D_{MIN}$ of the VCDL 24. In the example shown in FIG. 3, the minimum delay $D_{MIN}$ is about 40% of the period $t_{ck1}$ of the $RCLK_1$ signal. In the event the minimum delay $D_{MIN}$ is less than half the period $t_{ck}$ of the RCLK signal, the initialization circuit 20 is operable to set the programmable divider 14 so that it is bypassed, and the RCLK signal is used as the $CLK_{IN}$ signal. In the example shown in FIG. 3, the minimum delay $D_{MIN}$ is less than half the period $t_{ck1}$ of the $RCLK_1$ signal so that the $RCLK_1$ signal is applied to the VCDL 24 in normal operation.

In another example shown in FIG. 3, an $RCLK_2$ signal having a higher frequency causes a $CLK_{IN-2}$ signal to be generated by the programmable divider 14. As a result of the higher frequency of the $RLCK_2$ signal, the minimum delay $D_{MIN}$ is about 1.2 times the period $t_{ck2}$ of the $CLK_{IN-2}$ signal. The SELECT signals from the initialization circuit 20 is operable to program the divider 14 to divide the RCLK signal by two if the minimum delay $D_{MIN}$ is greater than one-half the period $t_{ck2}$ of the $CLK_{IN-2}$ signal and less than 1.5 the period $tck_2$ of the $CLK_{IN-2}$ signal. Since the minimum delay $D_{MIN}$ of the VCDL 24 is within this range, the initialization circuit 20 programs the divider 12 so that the $CLK_{IN-2}$ signal applied to the VCDL 24 has half the frequency of the $RCLK_2$ signal in normal operation.

By way of final example, an $RCLK_3$ signal having a very high frequency produces a signal $CLK_{IN-3}$ having a period $t_{ck3}$ that is less than half the minimum delay $D_{MIN}$ of the VCDL 24. The initialization circuit 20 is configured so that it programs the divider 14 to divide the RCLK signal by four if the minimum delay $D_{MIN}$ is greater than 1.5 the period $t_{ck}$ of the $CLK_{IN}$ signal. As a result, the initialization circuit 20 programs the divider 14 to divide the RCLK3 signal by four in normal operation. The resulting $CLK_{IN}$ signal produced during normal operation has a frequency of half the frequency of the $CLK_{IN-3}$ signal used during initialization, which is shown in FIG. 3.

It will be apparent from FIG. 3 that the frequency of the $CLK_{IN}$ signal applied to the VCDL is substantially lower for higher frequencies of the RCLK signal than it would be if the RCLK signal was applied directly to the input of the VCDL 24. As a result, the VCDL 24 uses less power because each of the delay stages 28 in the VCDL 24 switches at a slower rate. Another benefit is the tuning range of the VCDL won't need to be changed to accommodate a wide operating range.

Figure 4:
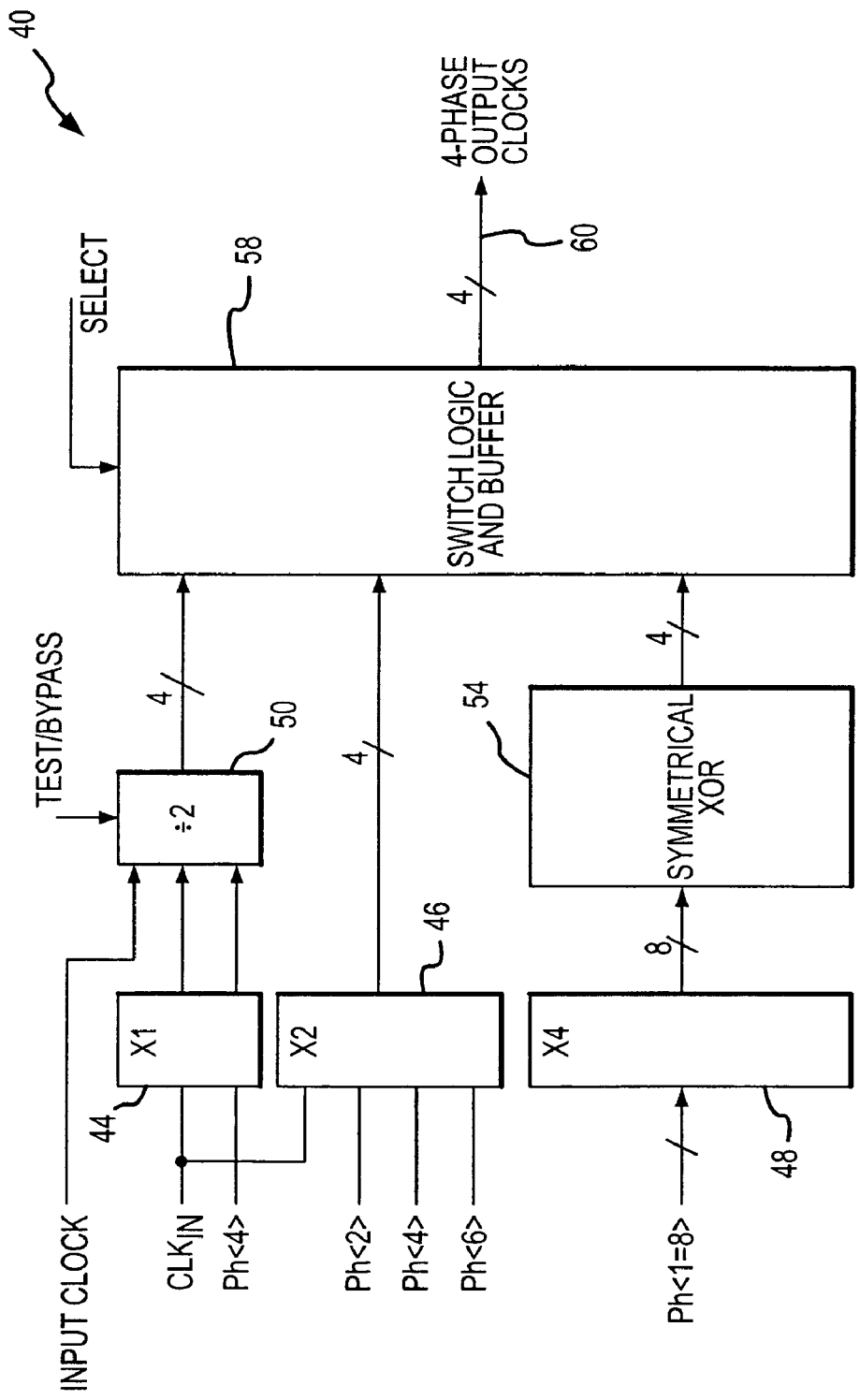
FIG. 4 is a block diagram of a phase mixer circuit according to one example of the invention that may be used in the delay-lock loop clock and control circuit of FIG. 2.

Returning to FIG. 2, it can be seen that the SELECT signals from the initialization circuit 20 are also coupled to the phase mixer 30 to control its operation depending on how the divider 14 is programmed. One example of a phase mixer 40 that can be used as the phase mixer 30 of FIG. 2 is shown in FIG. 4. The phase mixer 40 includes a first set of two buffers 44 that receive the $CLK_{IN}$ signal and the phase signal $PH_4$ from the middle delay stage $28_4$ in the VCDL 24. As explained below, these signals are used when the divider 14 is programmed to divide the RCLK signal by one. Also included in the phase mixer 40 is a second set of four buffers 46 that receive the $CLK_{IN}$ signal and the second, fourth and sixth phase $PH_{2,4,6}$ signals, respectively, from the delay stages $28_{2,4,6}$. These signals are used when the divider 14 is programmed to divide the RCLK signal by two. A third set of eight buffers 48 receive signals at all eight phases $PH_{1-8}$ from the delay stages $28_{1-8}$. These signals are used when the divider 14 is programmed to divide the RCLK signal by four.

Figure 5:
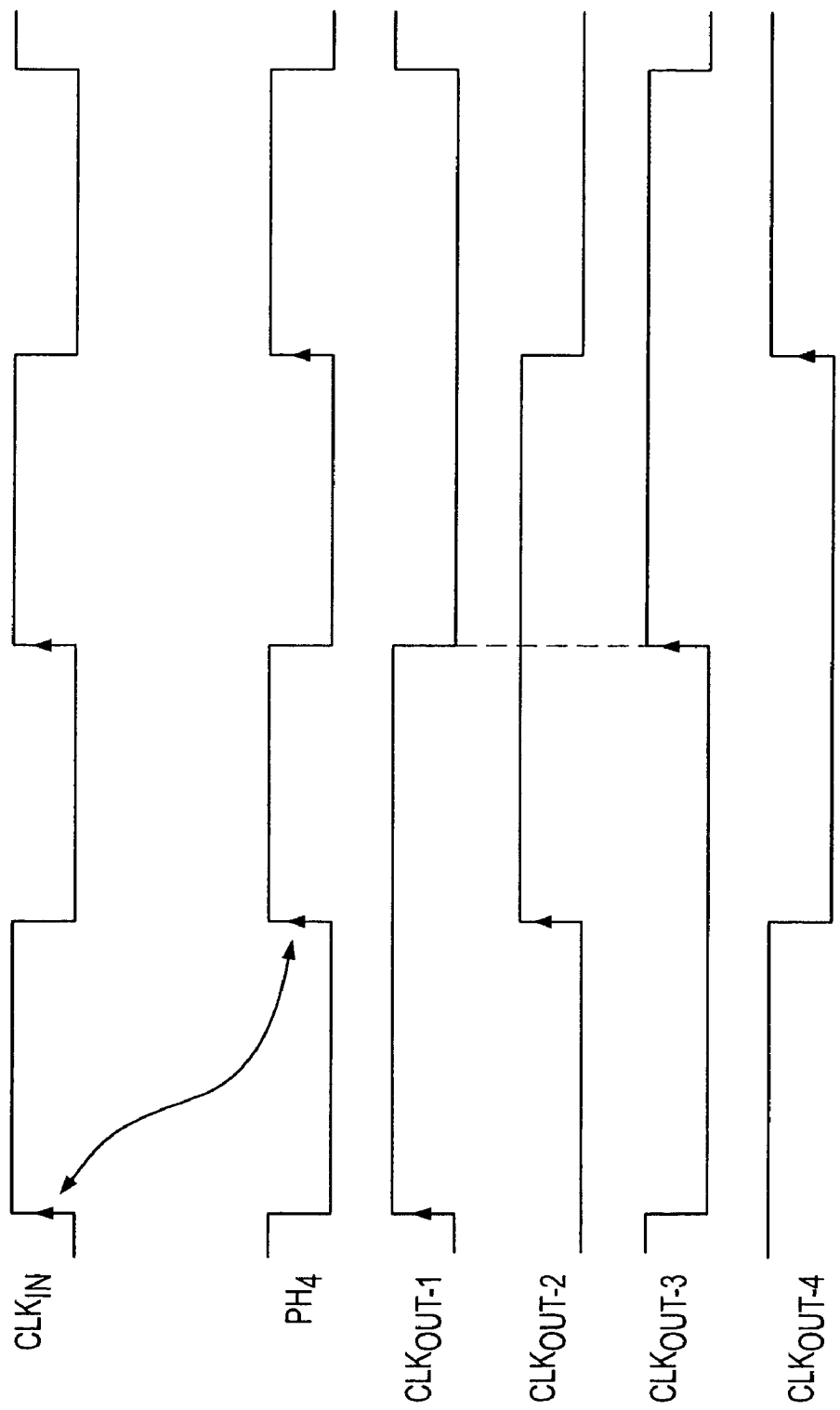
FIG. 5 is a timing diagram showing various signals that are present in the phase mixer of FIG. 4 when a reference clock signal is being applied to the delay-lock loop of FIG. 2.

The $CLK_{IN}$ and $PH_4$ signals from the buffers 44 are shown in FIG. 5. These signals are applied to a frequency divider 50 that generates four signals each having a frequency of one-half the frequency of the RCLK signal. The four signals $CLK_{OUT-1}$, $CLK_{OUT-2}$, $CLK_{OUT-3}$, and $CLK_{OUT-4}$ have phases of 0 degrees, 90 degrees, 180 degrees, and 270 degrees, respectively.

Figure 6:
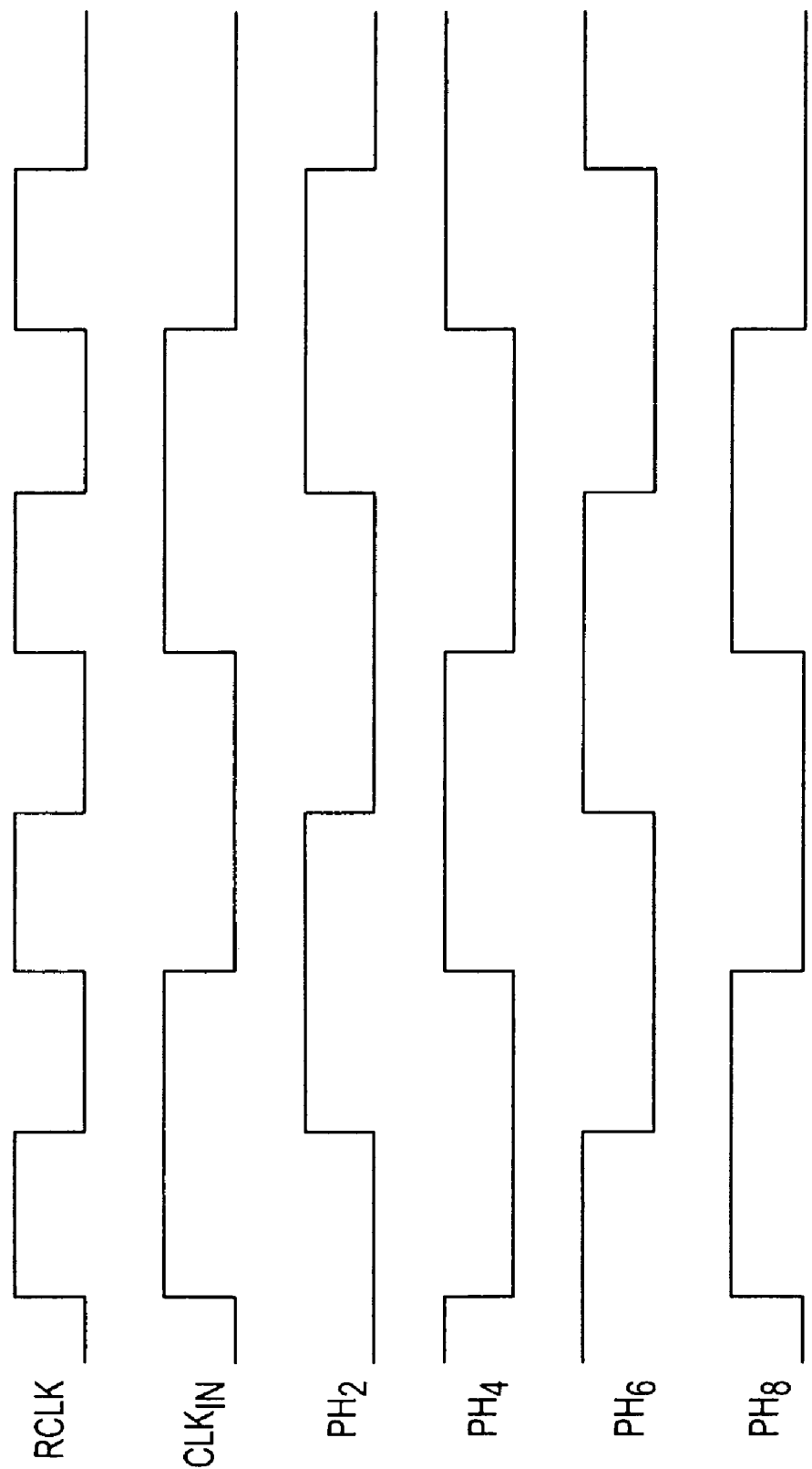
FIG. 6 is a timing diagram showing various signals that are present in the phase mixer of FIG. 4 when a signal having one-half the frequency of the reference clock signal is being applied to the delay-lock loop of FIG. 2.

The $PH_{2,4,6,8}$ signals from the buffers 46, as well as the RCLK signal and the $CLK_{IN}$ signal, which are used when the $CLK_{IN}$ signal has half the frequency of the RCLK signal, are shown in FIG. 6. Each of these $PH_{2,4,6,8}$ signals has half the frequency of the RCLK signal, and respective phases relative to the phase of the $CLK_{IN}$ signal of 90 degrees, 180 degrees, 270 degrees, and 360 degrees.

Figure 7:
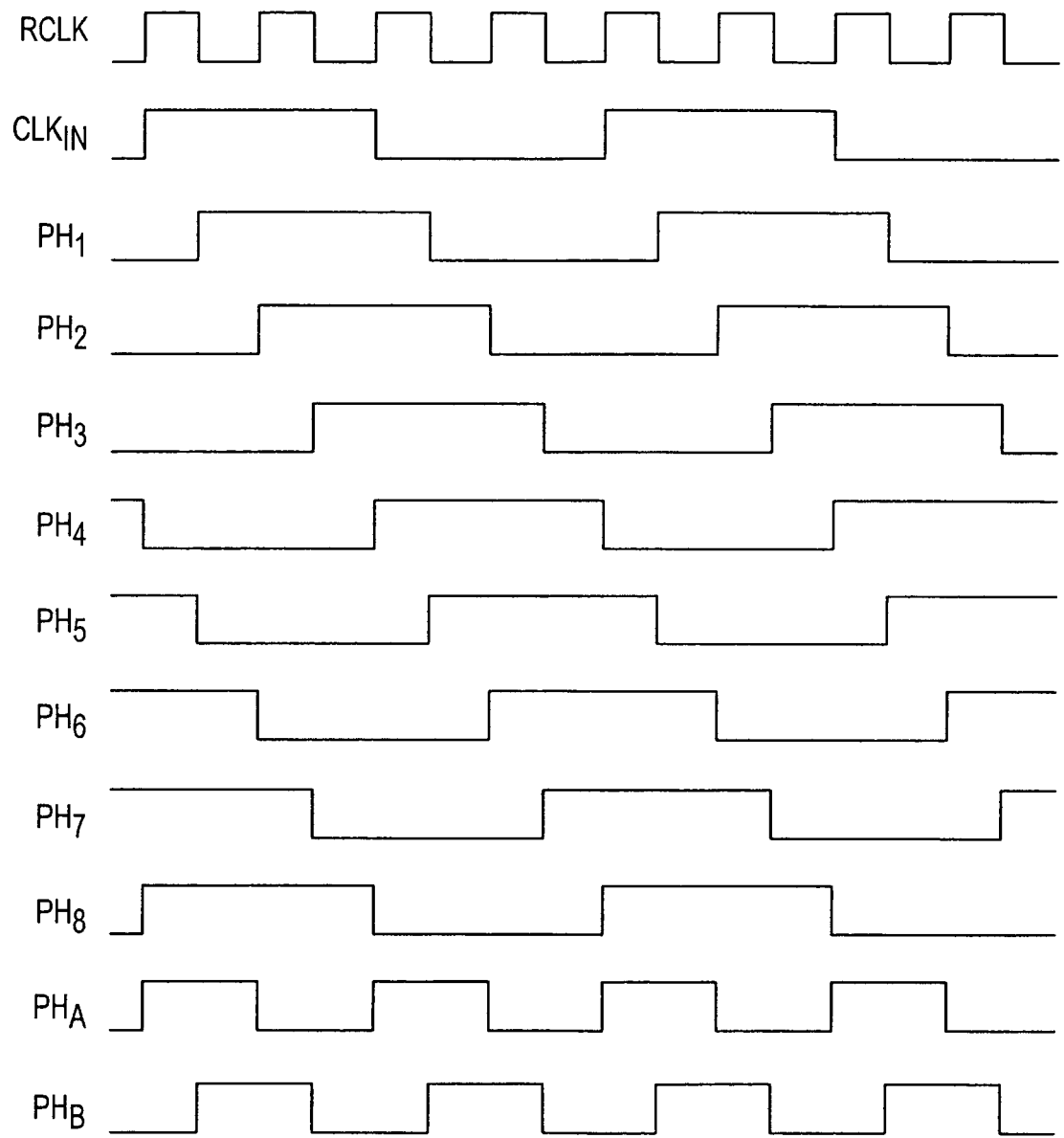
FIG. 7 is a timing diagram showing various signals that are present in the phase mixer of FIG. 4 when a signal having one-quarter the frequency of the reference clock signal is being applied to the delay-lock loop of FIG. 2.

The $PH_{1-8}$ signals from the buffers 48, as well as the RCLK signal and the $CLK_{IN}$ signal that are used when the RCLK signal is divided by four are shown in FIG. 7. As shown therein, each of the $PH_{1-8}$ signals has a frequency of one-quarter of the frequency of the RCLK signal, and phases relative to the $CLK_{IN}$ signal of 45, 90, 135, 180, 225, 270, 315 and 360 degrees, respectively. The $PH_{1-8}$ signals from the buffers 48 are applied to a pair of symmetrical exclusive OR gates 54. The gates 54 combines the $PH_{1-8}$ signals into four signals having one-half the frequency of the $PH_{1-8}$ signals. More specifically, one of the symmetrical exclusive OR gates 54 receives the $PH_{2,4,6,8}$ signals and generates a $PH_A$ signal, which is shown in FIG. 7, as well as its complement, which is not shown in FIG. 7. As can be seen from FIG. 7, the $PH_A$ signal and its complement have half the frequency of the RCLK signal, and they transition on each rising edge transition of the RCLK signal. The other one of the symmetrical exclusive OR gates 54 receives the $PH_{1,3,5,7}$ signals and generates a $PH_B$ signal, which is also shown in FIG. 7. As can be seen from FIG. 7, the $PH_B$ signal and its complement have half the frequency of the RCLK signal, and they transition on each falling edge transition of the RCLK signal.

The set of four signals from the divider 50, the set of four signals from the buffers 46, and the two $PH_A$ and $PH_B$ signals and their complements from the symmetrical exclusive OR gates 54 are all applied to a multiplexer 58. The multiplexer 58 receives the SELECT signals to cause it to select one of these sets of signals for coupling to output lines 60. The output lines 60 then couple the signals through a clock tree or other signal lines to circuitry that can, for example, capture or latch digital signals responsive thereto. Except for relatively low frequency RCLK signals, which can be easily coupled through these lines, the signals can be more easily coupled through the clock tree or other signal lines because they have frequencies that are half the frequency of the RCLK signal. However, they can be used to latch or capture signals in synchronism with each transition of the RCLK signal regardless of the frequency of the RCLK signal.

Although FIGS. 2 and 4 show a specific example of a delay-lock loop clock and control circuit 10, it will be understood that other examples with differing designs are also possible. For example, the RCLK signal could be divided by divisors other than 1, 2 and 4 based on the frequency of the RCLK signal in relation to the minimum delay of a delay line used in the delay-lock loop. Furthermore, the signals produced by the delay-line could be combined and/or selected in a manner different from the manner in which the signals are selected by the phase mixer 40 shown in FIG. 4. Also, rather than the phase detector 18 receiving the $CLK_{IN}$ signal applied to the programmable divider 14, the phase detector 18 could receive the RCLK signal from the output of the programmable divider 14. Other variations will be apparent to one skilled in the art.

Delay-lock loops and control circuits according to various embodiments of the invention can be used for a variety of purposes in electronic devices, such as memory devices. For example, with reference to FIG. 8, a synchronous dynamic random access memory ("SDRAM") 100 includes a command decoder 104 that controls the operation of the SDRAM 100 responsive to high-level command signals received on a control bus 106 and coupled through input receivers 108. These high level command signals, which are typically generated by a memory controller (not shown in FIG. 2), are a clock enable signal CKE*, a clock signal CLK, a chip select signal CS*, a write enable signal WE*, a row address strobe signal RAS*, a column address strobe signal CAS*, and a data mask signal DQM, in which the "*" designates the signal as active low. The command decoder 104 generates a sequence of command signals responsive to the high level command signals to carry out the function (e.g., a read or a write) designated by each of the high level command signals. These command signals, and the manner in which they accomplish their respective functions, are conventional. Therefore, in the interest of brevity, a further explanation of these command signals will be omitted. The command decoder 104 also includes a mode register 105 that can be programmed by a user to control the operating modes and operating features of the SDRAM 100.

The SDRAM 100 includes an address register 112 that receives row addresses and column addresses through an address bus 114. The address bus 114 is generally coupled through input receivers 110 and then applied to a memory controller (not shown in FIG. 8). A row address is generally first received by the address register 112 and applied to a row address multiplexer 118. The row address multiplexer 118 couples the row address to a number of components associated with either of two memory banks 120, 122 depending upon the state of a bank address bit forming part of the row address. Associated with each of the memory banks 120, 122 is a respective row address latch 126, which stores the row address, and a row decoder 128, which decodes the row address and applies corresponding signals to one of the arrays 120 or 122. The row address multiplexer 118 also couples row addresses to the row address latches 126 for the purpose of refreshing the memory cells in the arrays 120, 122. The row addresses are generated for refresh purposes by a refresh counter 130, which is controlled by a refresh controller 132. The refresh controller 132 is, in turn, controlled by the command decoder 104.

After the row address has been applied to the address register 112 and stored in one of the row address latches 126, a column address is applied to the address register 112. The address register 112 couples the column address to a column address latch 140. Depending on the operating mode of the SDRAM 100, the column address is either coupled through a burst counter 142 to a column address buffer 144, or to the burst counter 142 which applies a sequence of column addresses to the column address buffer 144 starting at the column address output by the address register 112. In either case, the column address buffer 144 applies a column address to a column decoder 148.

Figure 8:
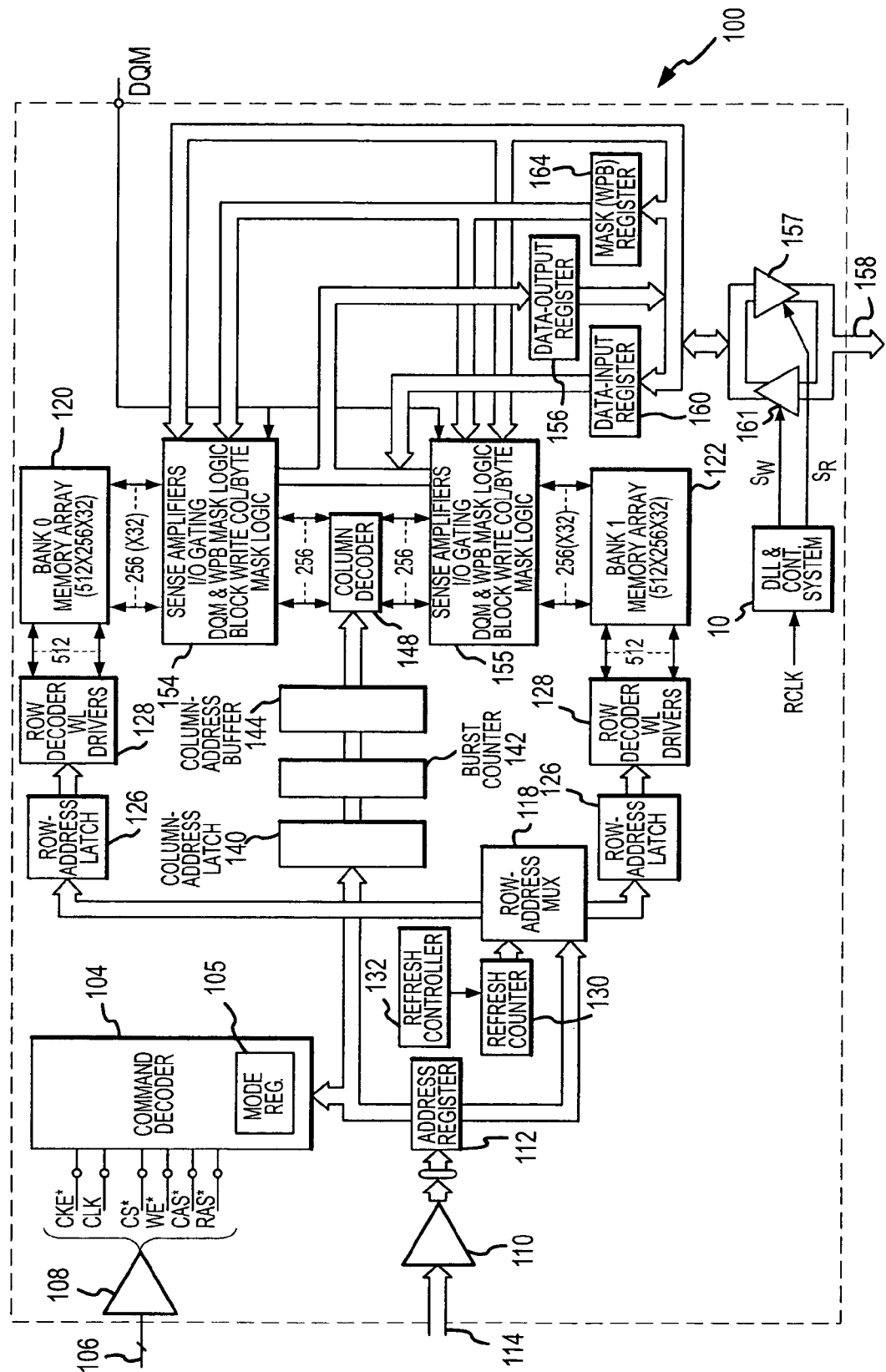
FIG. 8 is a block diagram of a memory device using the delay-lock loop and control circuit of FIG. 2 or some other example of the invention.

Data to be read from one of the arrays 120, 122 is coupled to the column circuitry 154, 155 for one of the arrays 120, 122, respectively. The data is then coupled through a data output register 156 and data output drivers 157 to a data bus 158. The data output drivers 157 apply the read data to the data bus 158 responsive to a read data strobe signal $S_R$ generated by the delay-lock loop and control circuit 10 or some other example of the invention. The SDRAM 100 shown in FIG. 8 is a double data rate ("DDR") SDRAM that inputs or outputs data twice each clock period. The delay-lock loop and control circuit 10 receives the periodic RCLK signal and generates the read data strobe $S_R$ using the signals from the multiplexer 58 (FIG. 4), as previously explained.

Data to be written to one of the arrays 120, 122 are coupled from the data bus 158 through data input receivers 161 to a data input register 160. The data input receivers 161 couple the write data from the data bus 158 responsive to a write data strobe signal $S_W$ generated by the delay-lock loop and control circuit 10 or by some other example of the invention. The delay-lock loop and control circuit 10 receives the periodic RCLK signal and generates the write data strobe $S_W$ signal also using the signals from the multiplexer 58. The write data are coupled to the column circuitry 154, 155 where they are transferred to one of the arrays 120, 122, respectively. A mask register 164 responds to a data mask DM signal to selectively alter the flow of data into and out of the column circuitry 154, 155, such as by selectively masking data to be read from the arrays 120, 122.

Figure 9:
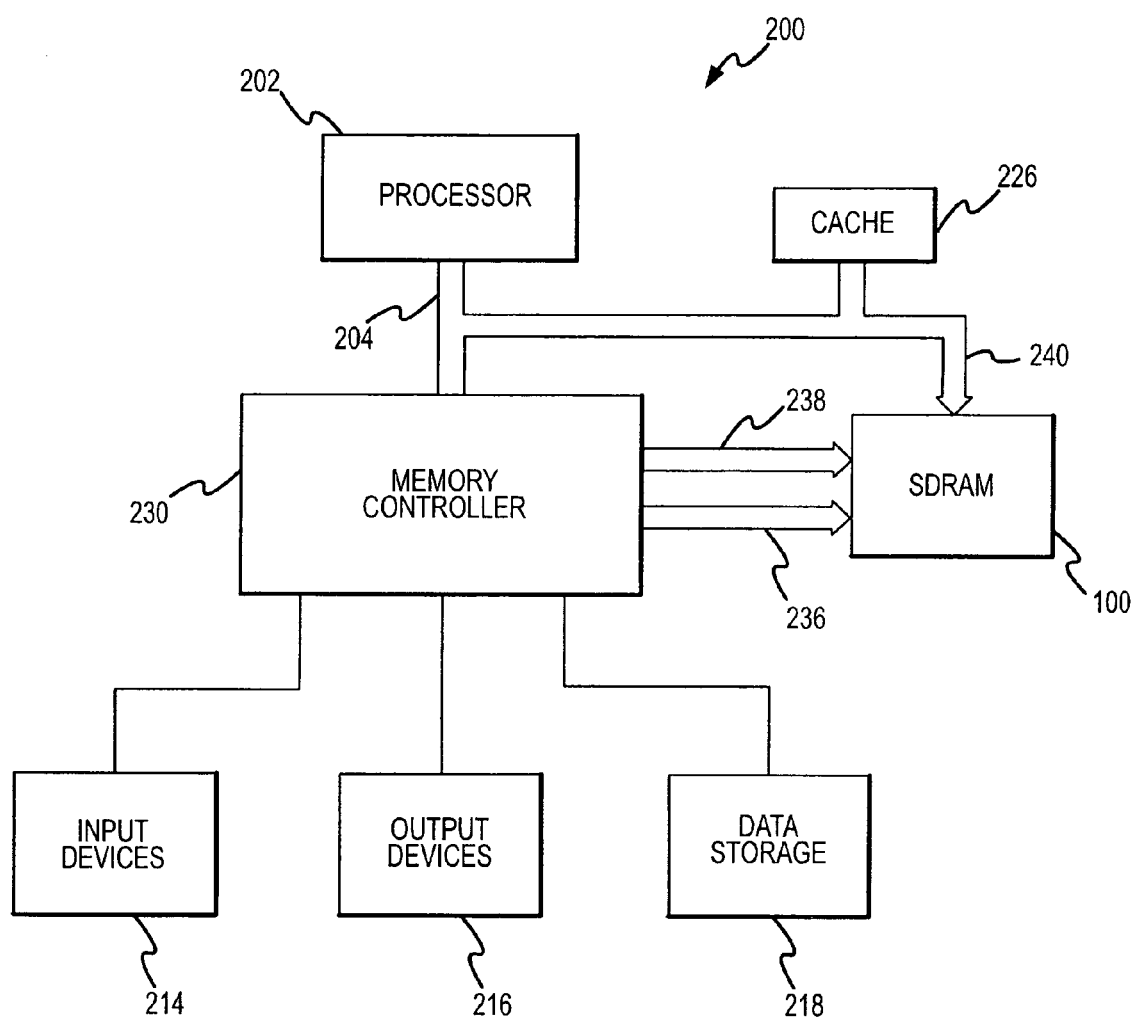
FIG. 9 is a block diagram of a computer system using the memory device of FIG. 8.

The SDRAM 100 shown in FIG. 8 can be used in various electronic systems. For example, it may be used in a processor-based system, such as a computer system 200 shown in FIG. 9. The computer system 200 includes a processor 202 for performing various computing functions, such as executing specific software to perform specific calculations or tasks. The processor 202 includes a processor bus 204 that normally includes an address bus, a control bus, and a data bus. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to allow the processor 202 to store data in or retrieve data from internal or external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM"), and to the SDRAM 100 through a memory controller 230. The memory controller 230 normally includes a control bus 236 and an address bus 238 that are coupled to the SDRAM 100. A data bus 240 is coupled from the SDRAM 100 to the processor bus 204 either directly (as shown), through the memory controller 230, or by some other means.

From the foregoing it will be appreciated that, although specific embodiments of the invention have been described herein for purposes of illustration, it will be understood by one skilled in the art that various modifications may be made without deviating from the spirit and scope of the invention. Accordingly, the invention is not limited except as by the appended claims.

What is claimed is:

1. A method of generating a plurality of output clock signals, comprising:
    dividing a reference clock signal to generate a divided clock signal having a frequency relative to the frequency of the reference clock signal that is reduced as the frequency of the reference clock signal increases;
    sequentially delaying the divided clock signal to generate a plurality of successively delayed clock signals; and
    combining a plurality of the delayed clock signals to generate the plurality of output clock signals, the number of the delayed clock signals being combined to generate the plurality of output clock signals increasing as the frequency of the reference clock signal increases.

2. The method of claim 1 wherein the act of dividing a reference clock signal to generate a divided clock signal having a frequency relative to the frequency of the reference clock signal that is reduced as the frequency of the reference clock signal increases comprises dividing a reference clock signal by integer numbers to generate the divided clock signal as the frequency of the reference clock signal increases from each of a plurality of respective ranges to the next.

3. The method of claim 1 further comprising the step of adjusting the magnitude of the sequential delays so that one of the delayed clock signals has a phase that is substantially equal to the reference clock signal.

4. The method of claim 1 further comprising the step of adjusting the magnitude of the sequential delays so that one of the delayed clock signals has a phase that is substantially equal to the divided clock signal.

5. The method of claim 1 wherein the act of combining a plurality of the delayed clock signals to generate the plurality of output clock signals comprises combining the plurality of the delayed clock signals in a manner so that the plurality of output clock signals have transitions that are coincident with the reference clock signal.

6. The method of claim 1 wherein the act of combining a plurality of the delayed clock signals to generate the plurality of output clock signals comprises combining the plurality of the delayed clock signals in a manner so that the plurality of output clock signals have transitions that are coincident with the divided clock signal.

7. A method of generating at least one output clock signal, comprising:

dividing a reference clock signal to generate a divided clock signal having a frequency relative to the frequency of the reference clock signal that is reduced as the frequency of the reference clock signal increases;

sequentially delaying the divided clock signal to generate a plurality of successively delayed clock signals;

adjusting the magnitude of the sequential delays so that one of the delayed clock signals has a phase that is substantially equal to either the reference clock signal or the divided clock signal; and combining a plurality of the delayed clock signals to generate the at least one output clock signal, the number of the delayed clock signals being combined to generate the at least one output clock signals increasing as the frequency of the reference clock signal increases.

* * * * *

UNITED STATES PATENT AND TRADEMARK OFFICE
CERTIFICATE OF CORRECTION

| | | |
|---|---|---|
| PATENT NO. | : 7,619,458 B2 | Page 1 of 1 |
| APPLICATION NO. | : 11/521837 | |
| DATED | : November 17, 2009 | |
| INVENTOR(S) | : Feng Lin | |

It is certified that error appears in the above-identified patent and that said Letters Patent is hereby corrected as shown below:

In column 1, line 9, delete "2005." and insert -- 2005, now Pat. No. 7,158,443. --, therefor.

Signed and Sealed this

Twelfth Day of January, 2010

David J. Kappos
*Director of the United States Patent and Trademark Office*

UNITED STATES PATENT AND TRADEMARK OFFICE
CERTIFICATE OF CORRECTION

PATENT NO.         : 7,619,458 B2                                        Page 1 of 1
APPLICATION NO. : 11/521837
DATED              : November 17, 2009
INVENTOR(S)        : Feng Lin It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 581 days.

Signed and Sealed this

Fourteenth Day of December, 2010

David J. Kappos
*Director of the United States Patent and Trademark Office*